US009166571B2

(12) United States Patent
Connell et al.

(10) Patent No.: US 9,166,571 B2
(45) Date of Patent: Oct. 20, 2015

(54) LOW POWER HIGH SPEED QUADRATURE GENERATOR

(71) Applicant: Futurewei Technologies, Inc., Plano, TX (US)

(72) Inventors: Lawrence E. Connell, Naperville, IL (US); Daniel P. McCarthy, Elk Grove Village, IL (US); Brian T. Creed, Batavia, IL (US); Kent Jaeger, Cary, IL (US)

(73) Assignee: Futurewei Technologies, Inc., Plano, TX (US)

( * ) Notice: Subject to any disclaimer, the term of this patent is extended or adjusted under 35 U.S.C. 154(b) by 149 days.

(21) Appl. No.: 13/934,306

(22) Filed: Jul. 3, 2013

(65) Prior Publication Data

US 2014/0361821 A1    Dec. 11, 2014

Related U.S. Application Data

(60) Provisional application No. 61/833,532, filed on Jun. 11, 2013.

(51) Int. Cl.
*H03K 3/00* (2006.01)
*H03K 3/356* (2006.01)

(52) U.S. Cl.
CPC .................... *H03K 3/356104* (2013.01)

(58) Field of Classification Search
CPC .......... G11C 11/412; G11C 7/12; G11C 7/00; G11C 11/413; H01L 27/0207; H01L 27/1104; G06F 17/505; G06F 17/5068; H03K 19/0185; H03K 19/018507; H03K 3/012; H03K 3/0375; H03K 3/356; H03K 19/0016; H03K 19/00338; H03K 19/017

USPC ......... 327/185, 198, 199, 208, 215, 218, 219, 327/225, 228, 115, 117, 118; 365/154, 156, 365/203, 189.05; 326/67, 68, 80, 81
See application file for complete search history.

(56) References Cited

U.S. PATENT DOCUMENTS 8,487,669 B2 * 7/2013 Hesen et al. .................. 327/115
2009/0284288 A1 * 11/2009 Zhang et al. .................. 327/118

OTHER PUBLICATIONS

Ghilioni, A., et al. "A 6.5mW Inductorless CMOS Frequency Divider-by-4 Operating up to 70GHz," IEEE International Solid-State Circuits Conference, ISSCC 2011/Session 16/mm-WAVE Design Techniques/16.3, 3 pgs.

(Continued)

*Primary Examiner* — Lincoln Donovan
(74) *Attorney, Agent, or Firm* — Conley Rose, P.C.; Grant Rodolph; William H. Dietrich

(57) ABSTRACT

An apparatus comprising a latch comprising a differential inverter configured to receive a differential input signal and generate a differential output signal, a pair of cross-coupled inverters coupled to the differential inverter, and a first clock switch configured to couple the differential inverter to a voltage source, a second clock switch configured to couple the differential inverter to a ground, wherein the first clock switch and the second clock switch are configured to receive a differential clock signal, and wherein the first clock switch and the second clock switch are both open or both closed depending on the differential clock signal, a second latch, wherein the first latch and the second latch are configured as a frequency divider, and a logic circuit coupled to each latch, wherein the logic circuits are configured to generate both an in-phase reference output signal and a quadrature output signal.

16 Claims, 6 Drawing Sheets

(56) References Cited

OTHER PUBLICATIONS

Connell, L, et al. "A CMOS Broadband Tuner IC," ISSCC 2002 Visuals Supplement, ISSCC 2002/Session 24/RF Systems/24.3, 3 pgs.

Lu, I. S-C., et al. "A SAW-less GSM/GPRS/EDGE Receiver Embedded in a 65nm CMOS SoC," IEEE International Solid-State Circuits Conference, ISSCC 2011/Session 21/Cellular/21.1, 3 pgs.

* cited by examiner

LOW POWER HIGH SPEED QUADRATURE GENERATOR

CROSS-REFERENCE TO RELATED APPLICATIONS

The present application claims benefit of U.S. Provisional Patent Application No. 61/833,532 filed Jun. 11, 2013 by Lawrence Connell, et al. and entitled "Low Power High Speed Quadrature Generator," which is incorporated herein by reference as if reproduced in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

A latch is an electronic circuit that may be used to store one bit of information. Latches are useful in a variety of applications, including quadrature generators. A quadrature generator may comprise a frequency divider that utilizes at least two latches. A frequency divider circuit may receive as an input signal a periodic signal of a given input frequency and may produce an output signal that is a periodic signal with a frequency that is a fraction (e.g., one-half) of the input frequency.

Quadrature generators may be used in mobile wireless communication devices, such as cell phones or smart phones, as part of, as an example, a local oscillator (LO) circuit. Given the constraints on power consumption of modern mobile wireless communication devices it is desirable to find new ways to reduce power consumption without sacrificing performance. An improved latch configuration is one means for reducing power consumption of a quadrature generator and therefore a communication device.

SUMMARY

In one embodiment, the disclosure includes an apparatus comprising a latch comprising a differential inverter configured to receive a differential input signal and generate a differential output signal, a pair of cross-coupled inverters coupled to the differential inverter, and a first clock switch configured to couple the differential inverter to a voltage source, a second clock switch configured to couple the differential inverter to a ground, wherein the first clock switch and the second clock switch are configured to receive a differential clock signal, and wherein the first clock switch and the second clock switch are both open or both closed depending on the differential clock signal, a second latch, wherein the first latch and the second latch are configured as a frequency divider, and a logic circuit coupled to each latch, wherein the logic circuits are configured to generate both an in-phase output signal and aquadrature output signal.

In another embodiment, the disclosure includes a quadrature generator comprising a first latch comprising a first clock switch configured to couple to a voltage source, and a second clock switch configured to couple to a ground, wherein the first clock switch and the second clock switch are configured to receive a differential clock signal, and wherein the first clock switch and the second clock switch are both open or both closed depending on the differential clock signal, wherein the first latch is configured to receive a first differential input signal and generate a first differential output signal, and wherein there is only one gate delay from a clock transition of the differential clock signal to a transition of the first differential output signal, a second latch coupled to the first latch in a feedback configuration, wherein the second latch is configured to receive the differential clock signal, and a logic circuit coupled to each latch, wherein the logic circuits are configured to generate both an in-phase reference output signal and a quadrature output signal.

In yet another embodiment, the disclosure includes a method comprising clocking a first latch and a second latch in a frequency divider and two pairs of NAND gates using a differential clock signal to generate a differential output signal that is one-half the frequency of the differential clock signal, wherein the first latch comprises a first differential complementary metal oxide semiconductor (CMOS) inverter, wherein the second latch comprises a second differential CMOS inverter, wherein the first differential CMOS inverter is coupled between a voltage supply and a ground via a first clock switch and a second clock switch, wherein the first latch and the second latch are configured in a feedback loop, wherein a first one of the two pairs of NAND gates generates an in-phase reference output signal, and wherein a second one of the two pairs of NAND gates generates a quadrature phase output signal.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Figure 1:
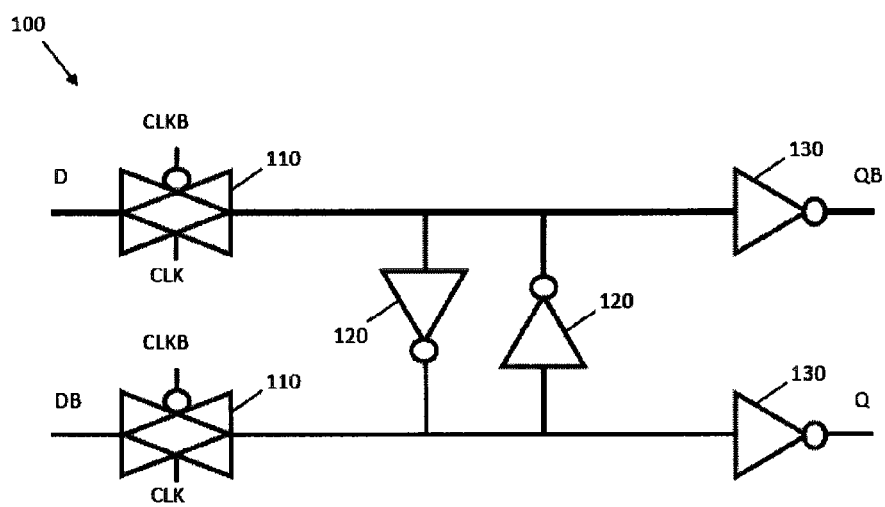
FIG. 1 is a schematic diagram of an embodiment of a prior art latch.

FIG. 1 is a schematic diagram of an embodiment of a prior art latch 100. The latch 100 comprises two transmission gates (t-gates) 110 and four inverters 120, 130 configured as shown in FIG. 1. The latch 100 is configured to receive differential inputs D and DB and produce differential outputs Q and QB (Q and QB may be said to comprise a differential output or differential output signal) as shown. The t-gates 110 may be clock controlled switching devices for each differential path. The t-gates 110 may be controlled by differential clock inputs CLK and CLKB as shown. Note that one way to generate CLKB may be by passing a clock signal CLK through an inverter, which may introduce a small time delay in which case there may be a small time delay between the transitions of CLK and CLKB. Such a small time delay would not upset the operation of the latch 100, and for the purposes of this application such CLK and CLKB signals are still referred to as a differential clock signal.

Each t-gate 110 may be an electronic element that selectively blocks or passes a signal from its input to its output as controlled by CLK and CLKB. T-gates, such as t-gates 110, typically comprise a p-channel metal oxide semiconductor (PMOS) transistor and a n-channel MOS (NMOS) transistor. The control gates of the PMOS and NMOS transistors may be biased in a complementary manner so that both transistors are either on or off. The differential t-gate input may be connected to ground and a power supply through a resistive path of a differential output inverter buffer from a preceding stage (not shown).

Note that for the latch 100 there may be two gate delays from a clock transition to an output transition. For example, on the upper differential path connecting input D to output QB, there may be a first gate delay through the t-gate 110 and a second gate delay through the inverter 130 between input D and output QB. Further, each differential output may require separate and non-shared clock controlled switches. Finally, the t-gates 110 may be connected to power and ground through the resistive paths of a differential output inverter buffer from a preceding stage (not shown), which slows switching speed. This combination of characteristics of the latch 100 limits the frequency that may be divided if the latch 100 is used in a frequency divider circuit.

Disclosed herein is a new latch structure that improves speed and reduces power consumption as compared with previous latches. When incorporated into a frequency divider or a quadrature generator, the new latch structure may operate at a significantly higher frequency than frequency dividers or quadrature generators that use previous latch structures.

Figure 2:
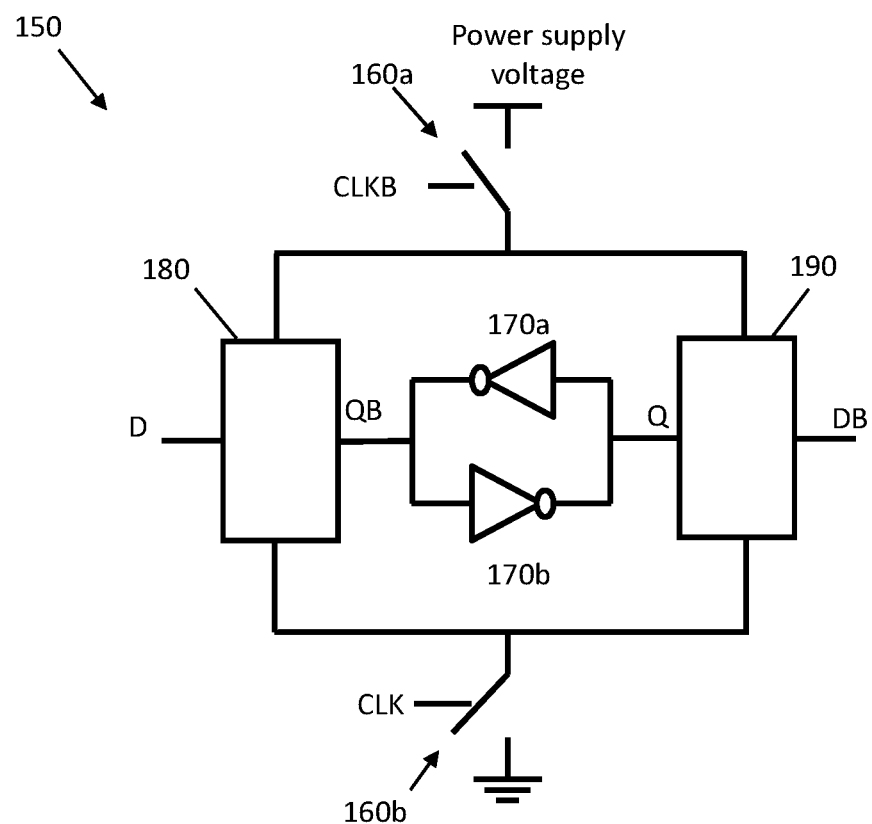
FIG. 2 is a schematic diagram of an embodiment of an exemplary latch.

FIG. 2 is a schematic diagram of an embodiment of an exemplary latch 150. The latch 150 comprises power supply switches 160a and 160b (sometimes referred to herein as clock switches), inverters 180 and 190, and cross-coupled inverters 170a and 170b configured as shown in FIG. 2. The clock switches 160a and 160b are configured to receive a differential clock signal, denoted as CLK and CLKB in FIG. 2. The clock switch 160a may be configured to couple to a power supply voltage as shown in FIG. 2. For example, the power supply voltage may be about 1.2 volts (V). The clock switch 160b may be configured to couple to a ground as shown in FIG. 2. In operation, the clock switch 160a is coupled to a power supply voltage, and the clock switch 160b is coupled to a ground. The switches 160a and 160b may be in an "on" state (i.e., closed) or an "off" state (i.e., open) depending on the signals CLK and CLKB. When CLK is high, this implies switch 160b is closed, CLKB is low, and switch 160a is closed. Conversely, when CLK is low, this implies switch 160b is open, CLKB is high, and switch 160b is open. That is, switches 160a, 160b are either both open or both closed together.

The inverters 180 and 190 are configured to receive a differential input, denoted as D and DB in FIG. 2. When switches 160a and 160b are closed, inverter 180 inverts input D to produce an output QB, and inverter 190 inverts DB to produce an output Q. The pair of inverters 180, 190 may be referred to as a differential inverter.

Figure 3:
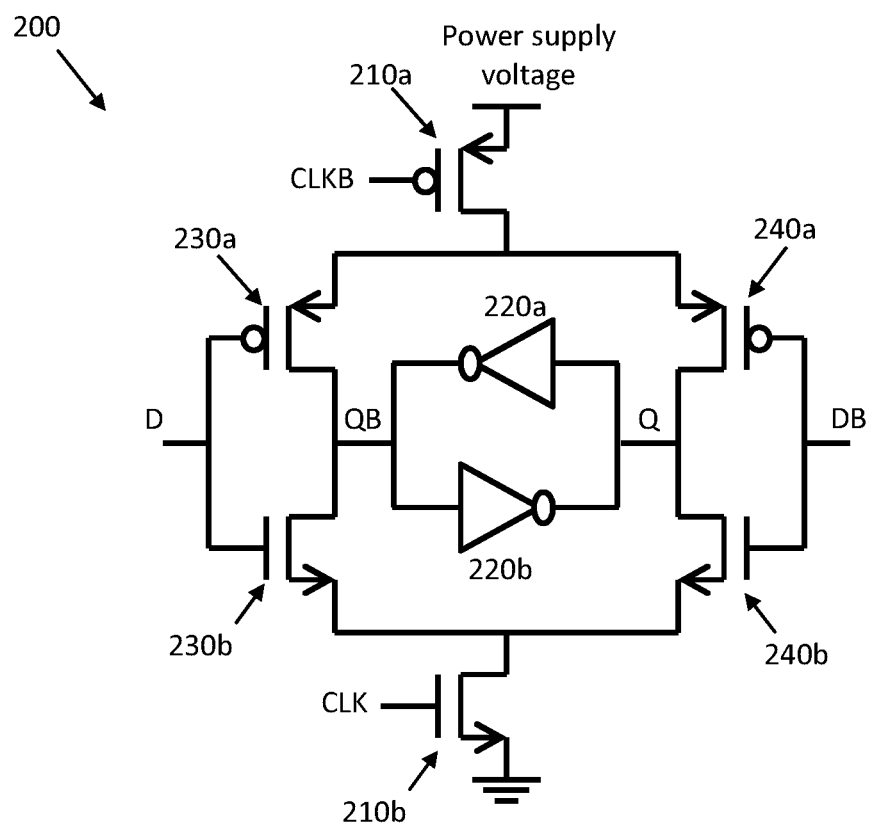
FIG. 3 is a schematic diagram of another embodiment of an exemplary latch.

FIG. 3 is a schematic diagram of another embodiment of a latch 200. The latch comprises power supply switch transistors 210a, 210b (sometimes referred to as clock switches), a single-stage CMOS inverter comprising transistors 230a and 230b, a second single-stage CMOS inverter comprising transistors 240a and 240b, and cross-coupled CMOS inverters 220a and 220b. The transistors 210a, 230a, and 240a are PMOS transistors, and the transistors 210b, 230b, and 240b are NMOS transistors. The clock switch 210a may be coupled to a power supply voltage at its source as shown in FIG. 3. For example, the power supply voltage may be about 1.2 volts (V). The latch 200 is configured to receive a differential input, denoted as D and DB in FIG. 3, and generate a differential output, denoted as QB and Q in FIG. 3. The clock switches 210a and 210b are configured to receive a differential clock signal, denoted as CLK and CLKB in FIG. 3. The clock switch 210a may be referred to as a high-side clock switch due to its connection to a positive voltage potential, and the clock switch 210b may be referred to as a low-side clock switch due to its connection to ground.

The operation of NMOS and PMOS transistors is well known to a person having ordinary skill in the art. However, for the sake of illustration, the operation of latch 200 is briefly described. If input D goes low, the gate voltage of the transistors 230a and 230b (which form a single-stage CMOS inverter) goes low. This may switch off NMOS transistor 230b and may switch on PMOS transistor 230a. If CLK goes high (and its complement CLKB goes low), this would switch on clock switches 210a and 210b. Thus, QB would be high (and QB's complement Q would be low). On the other hand, if CLK is low (and its complement CLKB goes high) the cross-coupled inverters will maintain the state that Q and QB were set to just previous to CLK going low and CLKB going high. The terms "high" and "low" may be understood by a person of ordinary skill in the art in the context of digital logic to refer to voltage states assigned to binary 1 or 0 (or vice versa).

In summary, the clock switches 210a, 210b may transfer data from the latch input D, DB to its output Q, QB when the clock signal CLK, CLKB enables the clock switches 210a, 210b. The cross-coupled inverters 220a, 220b may hold the data (i.e., store data) when the power supply switches are disabled. The number of gate delays from a clock transition to an output transition may be only one gate delay as compared with the two gate delays of the latch 100 of FIG. 1. Further, the switching device 210a controlled by the clock signal CLK is shared between the two differential outputs whereas the latch 100 requires a separate and non-shared clock controlled switching device for each differential path. For the same clock buffer loading this enables a factor of two increase in the drive strength of the clock controlled switching device.

As understood by a person of ordinary skill in the art, the latch 200 may be an embodiment of the latch 150 in FIG. 2. The clock switches 210a and 210b correspond to clock switches 160a and 160b, respectively. The inverters 220a and 220b correspond to inverters 170a and 170b, respectively. The transistors 230a and 230b correspond to inverter 180, and the transistors 240a and 240b correspond to inverter 190.

Figure 4:
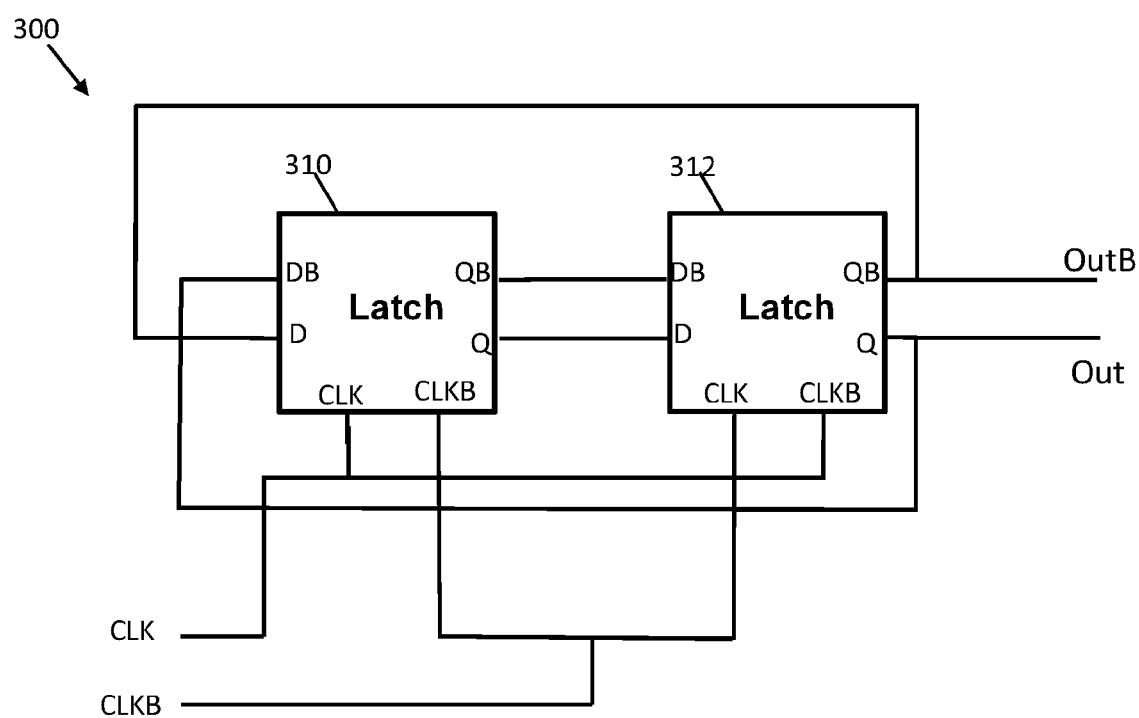
FIG. 4 is a schematic diagram of an embodiment of a frequency divider circuit.

FIG. 4 is a schematic diagram of an embodiment of a frequency divider circuit (or "frequency divider" for short) 300. The frequency divider 300 comprises two latches 310, 312 configured to receive a differential clock signal, denoted as CLK, CLKB. The latches 310, 312 may be connected in a feedback (or toggle-flop) configuration as shown, wherein an output of a first latch 310 is connected to the input of the second latch 312, and wherein the output of the second latch 312 is connected to the inverted input of the first latch 310. The first latch 310 is configured to receive a differential clock signal at the CLK and CLKB inputs. The same differential signal may be input to the second latch except that the signal input to CLKB in the first latch 310 is input to the CLK input in the second latch 312 as shown.

Each latch 310, 312 may be substantially the same as latches 100 or 200 presented previously, or any other latch configuration. The inputs to latches 310, 312 are denoted as D and DB, which is a differential input. The output of each latch is denoted as Q and QB, which is a differential output. The output of frequency divider 300 is denoted as Out and OutB in FIG. 4 and is a differential output. The frequency of the differential output is one-half the frequency of the input clock signal.

A person of ordinary skill in the art will appreciate how to use latches to form other frequency divider circuits that divide the input frequency by different amounts (e.g., one-third frequency, one-fourth frequency, and so on). For example, the two latches 310, 312 connected as shown in FIG. 4 may form a flip-flop. Two flip-flops connected in a feedback shift register configuration can provide an output signal with a frequency that is one-fourth the input frequency.

The latch 200 is significantly faster than the latch 100 due to the following attributes. The number of gate delays from a clock transition to an output transition in latch 200 is only one gate delay as opposed to two gate delays which are required for the latch 100. The switching device (e.g., switch 210a) controlled by a clock signal is shared between the two differential outputs Q and QB, whereas the latch 100 requires a separate and non-shared clock controlled switching device for each differential output. For the same clock buffer loading this enables a factor of two increase in the drive strength of the clock controlled switching device. The t-gates of latch 100 are replaced by power supply switches 210a, 210b, which are connected to a hard rail voltage. The t-gates 110 may be connected through the resistive paths of an output inverter buffer from a preceding stage, which slows the switching speed.

To further demonstrate the utility of latch 200, suppose a frequency divider 300 uses the latch 200 for each of the latches 310, 312 and is compared with another frequency divider 300 that uses latch 100 for each of the latches 310, 312. The maximum speed of the frequency divider that uses the latch 100 is approximately 8.9 gigahertz (GHz), wherein the maximum speed of the frequency divider that uses the latch 200 is approximately 12.8 GHz. The amplitude of the output of a frequency divider that uses the latch 200 at 12.8 GHz is only approximately 20% below the amplitude of the output at 2 GHz. Further, the power consumption of a frequency divider that uses latch 200 is approximately 20% less than the power consumption of a frequency divider that uses latch 100, while maintaining sufficiently low noise performance.

Figure 5:
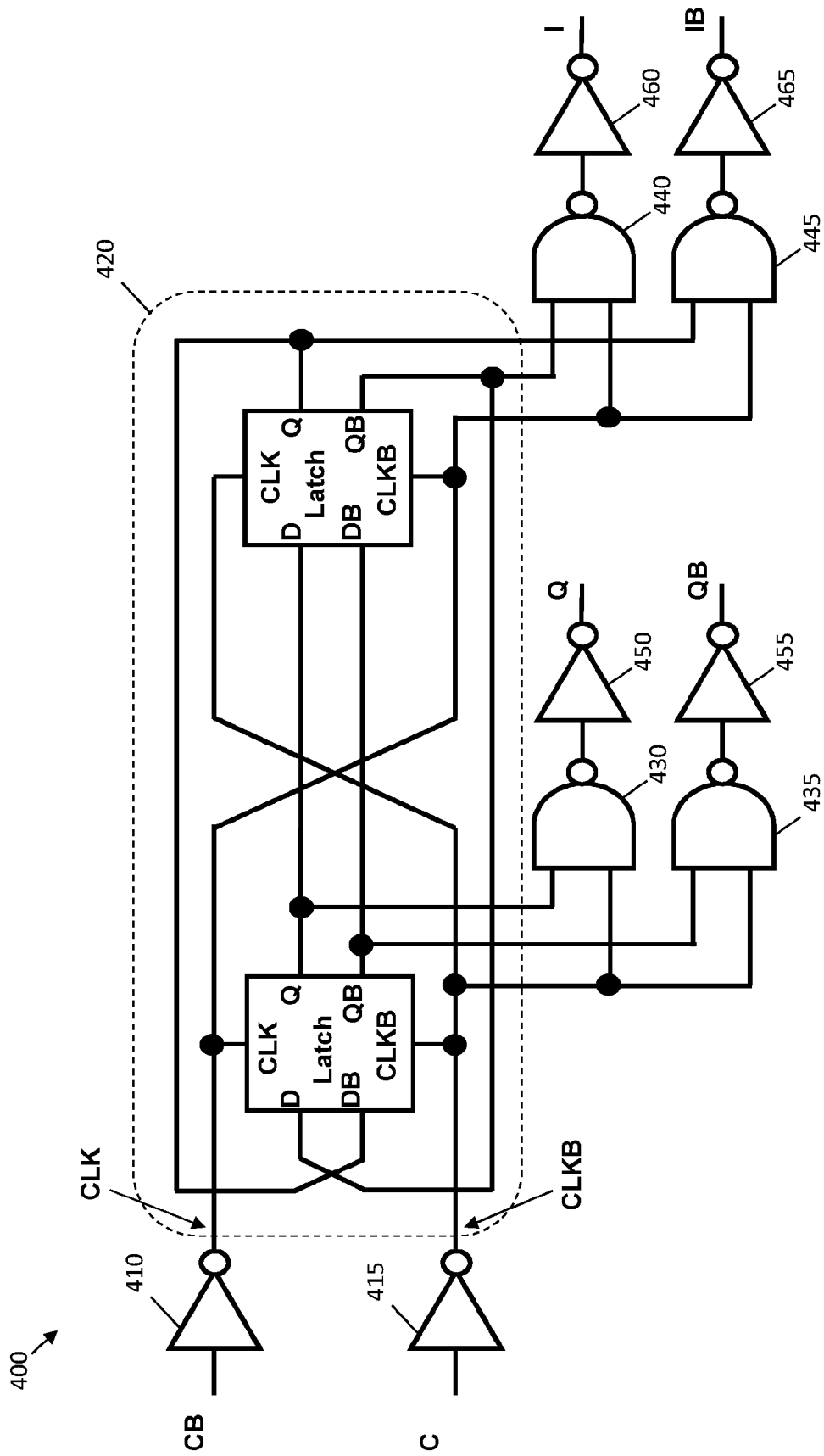
FIG. 5 is a schematic diagram of an embodiment of a quadrature generator.

FIG. 5 is a schematic diagram of an embodiment of a quadrature generator 400. The quadrature generator 400 comprises a pair of inverters 410, 415, a frequency divider 420, four NAND (not AND) gates 430-445, and four inverters 450-465 configured as shown in FIG. 5. The inverters 410, 415 may be referred to as "clock buffers", and the inverters 450-465 may be referred to as "output buffers." The inputs C and CB may be periodic signals, such as sinusoidal ("sine") waves or square waves. If C and CB are sine waves, the clock buffers 410, 415 may be used to "square up" the signal, or create outputs that are square waves. The clock buffers 410, 415 are optional if the differential clock signal C and CB comprises square waves.

The structure of frequency divider 420 is similar to frequency divider 300. For example, the frequency divider 420 comprises two latches configured in a feedback or toggle-flop configuration. Each latch in the frequency divider 420 may be substantially the same as latches 100 or 200 presented previously, or any other latch configuration. Further, the inputs CLK, CLKB, D, and DB of the latches are the same as the inputs by these labels in frequency divider 300, and the outputs Q and QB of the latches are the same as the outputs by these labels in frequency divider 300. Therefore, there is no need to describe the frequency divider 420 further.

The NAND gates 430-445 may each have a similar structure and may be any configuration of a CMOS NAND gate. As shown in FIG. 5, the NAND gate 440 is configured to receive an output QB of a first latch of the frequency divider 420 and a part of a differential clock signal CLK as inputs. Further as shown in FIG. 5, the NAND gate 430 is configured to receive an output Q of a second latch of the frequency divider 420 and a part of a differential clock signal CLKB as inputs. Further as shown in FIG. 5, the NAND gate 445 is configured to receive an output Q of the first latch and a part of the differential clock signal CLK as inputs. Finally, further as shown in FIG. 5, the NAND gate 435 is configured to receive an output QB of the second latch and the part of the differential clock signal CLKB as inputs.

As understood by a person of ordinary skill in the art, the quadrature generator 400 generates outputs labeled as Q, QB, I, and IB, respectively, from output buffers 450, 455, 460, and 465, respectively. The outputs I and IB may be referred to as an "in-phase reference signal," and the outputs Q and QB may be referred to as a "quadrature phase signal." Each of the outputs Q, QB, I, and IB may have approximately a 25% duty cycle (i.e., each output is high approximately 25% of the time and low approximately 75% of the time), assuming each of the differential clock signals CLK, CLKB has a 50% duty cycle. For example, the output Q of output buffer 450 may be high 25% of the time if the input signal to NAND gate 430 CLKB is high 50% of the time. Further, the outputs Q, QB, I, and IB are high during approximately non-overlapping time intervals, except that they may overlap during rise and fall transitions. Starting with the I signal, Q may be delayed 90 degrees out of phase with I, then IB will be delayed 90 degrees out of phase with Q, and then QB will be delayed 90 degrees out of phase with IB.

The clock buffers 450-465 may be configured to couple to a n-channel mixer. The clock buffers 450-465 may be optional if the quadrature generator 400 is used to drive a p-channel mixer. The NAND gates 440, 445 together with the output buffers 460, 465 may be considered as a logic circuit configured to generate an in-phase reference signal. Similarly, the NAND gates 430, 435, together with the output buffers 450, 455 may be considered as a logic circuit configured to generate a quadrature signal.

The outputs of the quadrature generator 400 configured with both latches of the frequency divider 420 as latches 200 described previously update on the edges of the clock signal, not the edges of the divider 420 output. This may allow the noise of the latches of the frequency divider 420 to be inconsequential. Use of the latch 200 in the frequency divider 420 allows for a smaller size latch design which decreases the current of the clock buffers 410, 415 by reducing the capacitive load on the clock buffers 410, 415. In addition, the smaller size design of the latch 200, as compared with the prior art latch 100, reduces the average switching current of the latches themselves.

Quadrature generators, such as quadrature generator 400, may be used in a variety of applications. For example, a quadrature generator may be used for a local oscillator (LO). A voltage-controlled oscillator (VCO) may be used to generate a sinusoid of a certain frequency. The VCO output frequency may be two times higher in frequency than the LO, so the VCO output frequency may be divided by two by a frequency divider, such as frequency divider 420, so that the VCO output can be used by a LO to drive a receive passive mixer in a wireless communication device, such as a cell phone or smart phone. Further, a quadrature generator, such as frequency divider 400, may also be used to drive a transmit passive mixer. Thus, it is possible that more than one quadrature generator may be used in a wireless communication device.

The latch 200 as compared with the prior art latch 100 has the following benefits. When operated at the same frequency, the power consumption of the quadrature generator 400 using the latch 200 is significantly less while maintaining the same output noise performance as compared with the quadrature generator 400 using the prior art latch 100. Further, the quadrature generator 400 using the latch 200 operates at a significantly higher frequency than the quadrature generator 400 using the prior art latch 100. For a given output phase noise requirement, the quadrature generator 400 using the latch 200 operates at significantly less current than with the prior art latch 100. For a given current, the quadrature generator 400 using the latch 200 operates significantly faster than with the prior art latch 100.

Some exemplary results comparing the prior art latch 100 to the latch 200 are as follows. For operation at 5.38 gigahertz (GHz) the quadrature generator 400 using the prior art latch 100 has a current drain of 3.711 milliamps (mA), an output phase noise of −157.6 decibels relative to carrier (dBc) at a 30 megahertz (MHz) offset, and an output phase noise of −160.4 dBc at a 120 MHz offset. In contrast, for operation at 5.38 GHz the quadrature generator 400 using the latch 200 has a current drain of 2.979 mA, an output phase noise of −158.6 dBc at a 30 MHz offset, and an output phase noise of −161 dBc at a 120 MHz offset. The current drain using the latch 200 is therefore reduced by 19.7% as compared with using the prior art latch 100, and the phase noise with the latch 200 is better than with the prior art latch 100. For an equal clock buffer load the quadrature generator 400 operates to a maximum frequency of 8.9 GHz using the prior art latch 100, and 10 GHz using the new high speed latch, which is a 12.3% increase in operating frequency.

Figure 6:
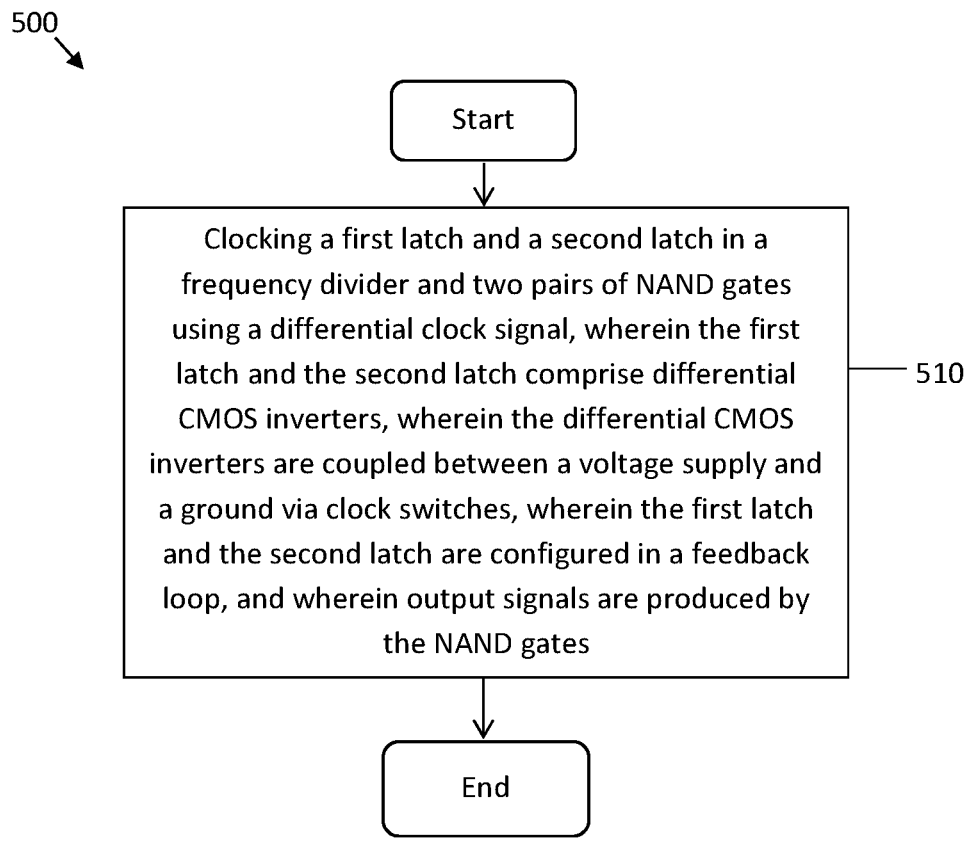
FIG. 6 is an embodiment of a method of generating a quadrature signal.

FIG. 6 is an embodiment of a method 500 for generating a quadrature signal. The method 500 comprises block 510. In block 510, a first latch, such as latch 200, and a second latch, such as latch 200, in a frequency divider, such as frequency divider 300, and two pairs of NAND gates, such as NAND gates 430, 435 and 440, 445, are clocked using a differential clock signal, wherein the first latch and the second latch comprise differential CMOS inverters, wherein the differential CMOS inverters are coupled between a voltage supply and a ground via clock switches, e.g., such as switches 210a and 210b for each of the two latches, wherein the first latch and the second latch are configured in a feedback loop, such as shown in FIG. 4, and wherein output signals are produced by the NAND gates.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. The use of the term "about" means +/−10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having may be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. An apparatus comprising:
a first latch comprising:
a differential inverter configured to receive a differential input signal and generate a differential output signal;
a pair of cross-coupled inverters coupled to the differential inverter; and
a first clock switch configured to couple the differential inverter to a voltage source;
a second clock switch configured to couple the differential inverter to a ground,
wherein the first clock switch and the second clock switch are configured to receive a differential clock signal, and wherein the first clock switch and the second clock switch are both open or both closed depending on the differential clock signal;
a second latch, wherein the first latch and the second latch are configured as a frequency divider;
a logic circuit coupled to the first latch, wherein the logic circuit is configured to generate an in-phase reference output signal from a differential output of the first latch; and
a second logic circuit coupled to the second latch, wherein the second logic circuit is configured to generate a quadrature signal,
wherein the logic circuit comprises a first NAND gate coupled to the first latch, a first output buffer connected in series to the first NAND gate, a second NAND gate coupled to the second latch, and a second output buffer connected in series to the second NAND gate, and
wherein the in-phase reference output signal is output from the first output buffer and the quadrature signal is output from the second output buffer.

2. The apparatus of claim 1, wherein the differential inverter comprises a first complementary metal oxide semiconductor (CMOS) inverter and a second CMOS inverter, wherein a first source of the first CMOS inverter is connected to a first source of the second CMOS inverter, and wherein a second source of the first CMOS inverter is connected to a second source of the second CMOS inverter.

3. The apparatus of claim 2, wherein the first clock switch is coupled to the first source of the first CMOS inverter and the first source of the second CMOS inverter, and wherein the second clock switch is coupled to the second source of the first CMOS inverter and the second source of the second CMOS inverter.

4. The apparatus of claim 3, wherein the first clock switch is a p-channel MOS (PMOS) transistor, and wherein the second clock switch is a n-channel MOS (NMOS) transistor.

5. The apparatus of claim 2, wherein the first CMOS inverter comprises a first p-channel MOS (PMOS) transistor and a first n-channel MOS (NMOS) transistor, wherein the drain of the first PMOS transistor is directly connected to the drain of the first NMOS transistor, wherein the first source of the first CMOS inverter is the source of the first PMOS transistor, and wherein the second source of the first CMOS inverter is the source of the NMOS transistor.

6. The apparatus of claim 5, wherein the second CMOS inverter comprises a second PMOS transistor and a second NMOS transistor, wherein the drain of the second PMOS transistor is directly connected to the drain of the second NMOS transistor, wherein the first source of the second CMOS inverter is the source of the second PMOS transistor, and wherein the second source of the second CMOS inverter is the source of the second NMOS transistor.

7. The apparatus of claim 6, wherein the pair of cross-coupled inverters is connected between the drain of the first PMOS transistor and the drain of the second PMOS transistor.

8. A quadrature generator comprising:
a first latch comprising:
a first clock switch configured to couple to a voltage source; and
a second clock switch configured to couple to a ground, wherein the first clock switch and the second clock switch are configured to receive a differential clock signal, and wherein the first clock switch and the second clock switch are both open or both closed depending on the differential clock signal,
wherein the first latch is configured to receive a first differential input signal and generate a first differential output signal, and wherein there is only one gate delay from a clock transition of the differential clock signal to a transition of the first differential output signal;
a second latch coupled to the first latch in a feedback configuration, wherein the second latch is configured to receive the differential clock signal;
a logic circuit coupled to the first latch, wherein the logic circuit is configured to generate an in-phase reference output signal from a differential output of the first latch; and
a second logic circuit coupled to the second latch, wherein the second logic circuit is configured to generate a quadrature output signal,
wherein the logic circuit comprises a first NAND gate coupled to the first latch, a first output buffer connected in series to the first NAND gate, a second NAND gate coupled to the second latch, and a second output buffer connected in series to the second NAND gate, and
wherein the in-phase reference output signal is output from the first output buffer and the quadrature signal is output from the second output buffer.

9. The quadrature generator of claim 8, wherein the first latch further comprises:
a differential inverter configured to receive the first differential input signal and generate the first differential output signal, wherein the differential inverter is coupled to the first clock switch and the second clock switch.

10. The quadrature generator of claim 9, wherein the first latch further comprises:
a pair of cross-coupled inverters coupled to the differential inverter, wherein the cross-coupled inverters are configured to store data when the first clock switch and the second clock switch are open, and wherein the first clock switch is a p-channel MOS (PMOS) transistor, and wherein the second clock switch is a n-channel MOS (NMOS) transistor.

11. The quadrature generator of claim 9, wherein the differential inverter comprises a first complementary metal oxide semiconductor (CMOS) inverter and a second CMOS inverter, wherein a first source of the first CMOS inverter is connected to a first source of the second CMOS inverter, and wherein a second source of the first CMOS inverter is connected to a second source of the second CMOS inverter.

12. The quadrature generator of claim 11, wherein the first CMOS inverter comprises a first p-channel MOS (PMOS) transistor and a first n-channel MOS (NMOS) transistor, wherein the drain of the first PMOS transistor is directly connected to the drain of the first NMOS transistor, wherein the first source of the first CMOS inverter is the source of the first PMOS transistor, and wherein the second source of the first CMOS inverter is the source of the first NMOS transistor.

13. The quadrature generator of claim 12, wherein the first clock switch is coupled to the first source of the first CMOS inverter and the first source of the second CMOS inverter, and wherein the second clock switch is coupled to the second source of the first CMOS inverter and the second source of the second CMOS inverter.

14. A method comprising:
clocking a first latch and a second latch in a frequency divider and two pairs of NAND gates using a differential clock signal to generate a differential output signal that is one-half the frequency of the differential clock signal, wherein the first latch comprises a first differential complementary metal oxide semiconductor (CMOS) inverter, wherein the second latch comprises a second differential CMOS inverter, wherein the first differential CMOS inverter is coupled between a voltage supply and a ground via a first clock switch and a second clock switch, wherein the first latch and the second latch are configured in a feedback loop, wherein a first one of the two pairs of NAND gates generates an in-phase reference output signal, and wherein a second one of the two pairs of NAND gates generates a quadrature output signal.

15. The method of claim 14, wherein the first latch is configured to generate the differential output signal, and wherein there is only one gate delay from a clock transition of the differential clock signal to a transition of the differential output signal.

16. The method of claim 14, wherein the second differential CMOS inverter is coupled between a voltage supply and a ground via a third clock switch and a fourth clock switch, and wherein the second latch is configured to generate a second differential output signal, and wherein there is only one gate delay from a clock transition of the differential clock signal to a transition of the second differential output signal.

* * * * *